United States Patent
Hyogo et al.

(10) Patent No.: US 11,216,709 B2
(45) Date of Patent: Jan. 4, 2022

(54) NON-TRANSITORY COMPUTER-READABLE STORAGE MEDIUM FOR STORING PROGRAM, OUTPUT METHOD, AND OUTPUT SYSTEM

(71) Applicant: FUJITSU LIMITED, Kawasaki (JP)

(72) Inventors: Ryosuke Hyogo, Yokohama (JP); Masahiro Kataoka, Kamakura (JP); Kota Natsume, Ota (JP); Taizou Shirakata, Mishima (JP)

(73) Assignee: FUJITSU LIMITED, Kawasaki (JP)

( * ) Notice: Subject to any disclaimer, the term of this patent is extended or adjusted under 35 U.S.C. 154(b) by 21 days.

(21) Appl. No.: 16/364,185

(22) Filed: Mar. 26, 2019

(65) Prior Publication Data
US 2019/0220712 A1    Jul. 18, 2019

Related U.S. Application Data

(63) Continuation of application No. PCT/JP2016/080283, filed on Oct. 12, 2016.

(51) Int. Cl.
| | |
|---|---|
| *G06K 15/02* | (2006.01) |
| *H04N 1/41* | (2006.01) |
| *H04N 1/00* | (2006.01) |
| *H04N 1/64* | (2006.01) |

(Continued)

(52) U.S. Cl.
CPC ....... *G06K 15/181* (2013.01); *G06K 15/1807* (2013.01); *G06K 15/1898* (2013.01); *H03M 7/3088* (2013.01); *H03M 7/42* (2013.01); *H03M 7/707* (2013.01); *H04N 1/00* (2013.01); *H04N 1/41* (2013.01); *H04N 1/648* (2013.01)

(58) Field of Classification Search
None
See application file for complete search history.

(56) References Cited

U.S. PATENT DOCUMENTS

| | | | |
|---|---|---|---|
| 5,465,322 A | * | 11/1995 | Hsu ........................ G06K 15/00 358/1.15 |
| 5,893,102 A | * | 4/1999 | Maimone ................ G06T 9/005 |
| 6,480,295 B1 | | 11/2002 | Taoda |

(Continued)

FOREIGN PATENT DOCUMENTS

| | | |
|---|---|---|
| JP | 11-177788 A | 7/1999 |
| JP | 2005-012495 A | 1/2005 |

(Continued)

OTHER PUBLICATIONS

Japanese Notice of Reasons for Refusal dated Oct. 23, 2019 in Japanese Application No. 2018-544626.

(Continued)

*Primary Examiner* — Mohammad H Ghayour
*Assistant Examiner* — Pawan Dhingra
(74) *Attorney, Agent, or Firm* — Xsensus LLP

(57) ABSTRACT

An output method executed by a computer includes: receiving compressed data encoded in a state in which a page break is identifiable in print data having a plurality of pages and an encoding dictionary used for the encoding; identifying the page break of the received compressed data and partially decompressing the received compressed data into the print data in units of pages, by using the encoding dictionary; and outputting the print data in order of the decompression.

7 Claims, 13 Drawing Sheets

(51) Int. Cl.
*H03M 7/42* (2006.01)
*H03M 7/30* (2006.01)

(56) References Cited

U.S. PATENT DOCUMENTS

| | | | |
|---|---|---|---|
| 2010/0225969 A1 | 9/2010 | Sato | |
| 2013/0200734 A1* | 8/2013 | Greer | B32B 5/02 |
| | | | 310/59 |
| 2013/0250341 A1* | 9/2013 | Shimizu | G06K 15/1807 |
| | | | 358/1.14 |

FOREIGN PATENT DOCUMENTS

| | | |
|---|---|---|
| JP | 2006-345374 A | 12/2006 |
| JP | 2010-233201 A | 10/2010 |
| JP | 2011-145883 A | 7/2011 |
| JP | 2012-212316 A | 11/2012 |
| JP | 2013-075487 A | 4/2013 |
| JP | 2013-200734 A | 10/2013 |

OTHER PUBLICATIONS

International Search Report dated Dec. 27, 2016 PCT/JP2016/080283, filed on Oct. 12, 2016, 11 pages including English Translation.

* cited by examiner

FIG. 3

"itemName","itemID","Num","ShopID","pageNum"

| itemA, | ID01, | 20, | ShopA, | 100 |
| itemB, | ID02, | 10, | ShopB, | 100 |
| itemC, | ID03, | 10, | ShopC, | 101 |
| itemD, | ID04, | 10, | ShopD, | 102 |
| ... | | | | |
| itemZ, | ID30, | 30, | ShopZ, | 110 |

FIG. 4

```
"itemName","itemID","Num","ShopID","pageNum"
    A,    01,    N2,    SA,    A0  ┐
                                   │ BLOCK
    B,    02,    N1,    SB,    A0  ┘

C,    03,    N1,    SC,    A1  ┐
                                   │ BLOCK
    D,    04,    N1,    SD,    A2  ┘
        ...
    Z,    30,    N3,    SZ,    A10
```

FIG. 5

| CODE | VALUE |
|------|-------|
| A | itemA |
| B | itemB |
| ⋮ | ⋮ |
| 01 | ID01 |
| 02 | ID02 |
| ⋮ | ⋮ |
| N1 | 10 |
| N2 | 20 |
| ⋮ | ⋮ |
| SA | ShopSA |
| SB | ShopSB |
| ⋮ | ⋮ |
| A0 | 100 |
| A1 | 101 |
| ⋮ | ⋮ |
| A10 | 110 |

FIG. 7

"itemName","itemID","Num","ShopID","pageNum"

| A, | 01, | N2, | SA, | A0 | ⎤ |
|----|-----|-----|-----|----|---|
| B, | 02, | N1, | SB, | A0 | ⎦ BLOCK |
| C, | 03, | N1, | SC, | A1 | ⎤ |
| D, | 04, | N1, | SD, | A2 | ⎦ BLOCK |

FIG. 9

"itemName","itemID","Num","ShopID","pageNum"

itemA,   ID01,   20,   ShopA,   100
itemB,   ID02,   10,   ShopB,   100 itemC,   ID03,   10,   ShopC,   101

...

itemZ,   ID30,   30,   ShopZ,   110

NON-TRANSITORY COMPUTER-READABLE STORAGE MEDIUM FOR STORING PROGRAM, OUTPUT METHOD, AND OUTPUT SYSTEM

CROSS-REFERENCE TO RELATED APPLICATION

This application is a continuation application of International Application PCT/JP2016/080283 filed on Oct. 12, 2016 and designated the U.S., the entire contents of which are incorporated herein by reference.

FIELD

The embodiment discussed herein is related to a non-transitory computer-readable storage medium for storing a program, an output method, and an output system.

BACKGROUND

In the related art, for example, in transferring data for a form to another base and outputting such as printing, a transfer source compresses entire data for the form and transfers the compressed data to an output base. At a transfer destination base, the compressed data is decompressed and output. For example, ZIP compression having a relatively high compression ratio is used for compression of data for the form. With this configuration, a data transfer capacity is reduced and the time from the start of transfer of the compressed data to completion of output of data for the form is shortened.

An example of the related art includes Japanese Laid-open Patent Publication No. 2010-233201.

SUMMARY

According to an aspect of the embodiments, an output method executed by a computer includes: receiving compressed data encoded in a state in which a page break is identifiable in print data having a plurality of pages and an encoding dictionary used for the encoding; identifying the page break of the received compressed data and partially decompressing the received compressed data into the print data in units of pages, by using the encoding dictionary; and outputting the print data in order of the decompression.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 3 is a diagram illustrating an example of a text file before encoding;

FIG. 4 is a diagram illustrating an example of encoded data;

FIG. 5 is a diagram illustrating an example of an encoding dictionary;

FIG. 7 is a diagram illustrating an example of encoded data received by the decoding device;

FIG. 9 is a diagram illustrating an example of encoding in units of pages;

DESCRIPTION OF EMBODIMENTS

However, after the compressed data compressed using the ZIP compression is received at the transfer destination base and the compressed data is collectively decompressed, a printing output of data for the form is started. For that reason, the time from when output of data for the form is instructed until when the first output (first print) is started becomes longer.

As one aspect of the embodiment, provided are a recording medium storing an output program, an output method, and an output system for enabling the time until the first print is started to be shortened.

Hereinafter, examples of a recording medium storing an output program, an output method, and an output system disclosed in the present application will be described in detail with reference to the drawings. The scope of right of the application is not limited by the examples. Respective examples can be appropriately combined to the extent that the examples are not inconsistent with processing contents.

EXAMPLE 1

Outline of Processing

Figure 1:
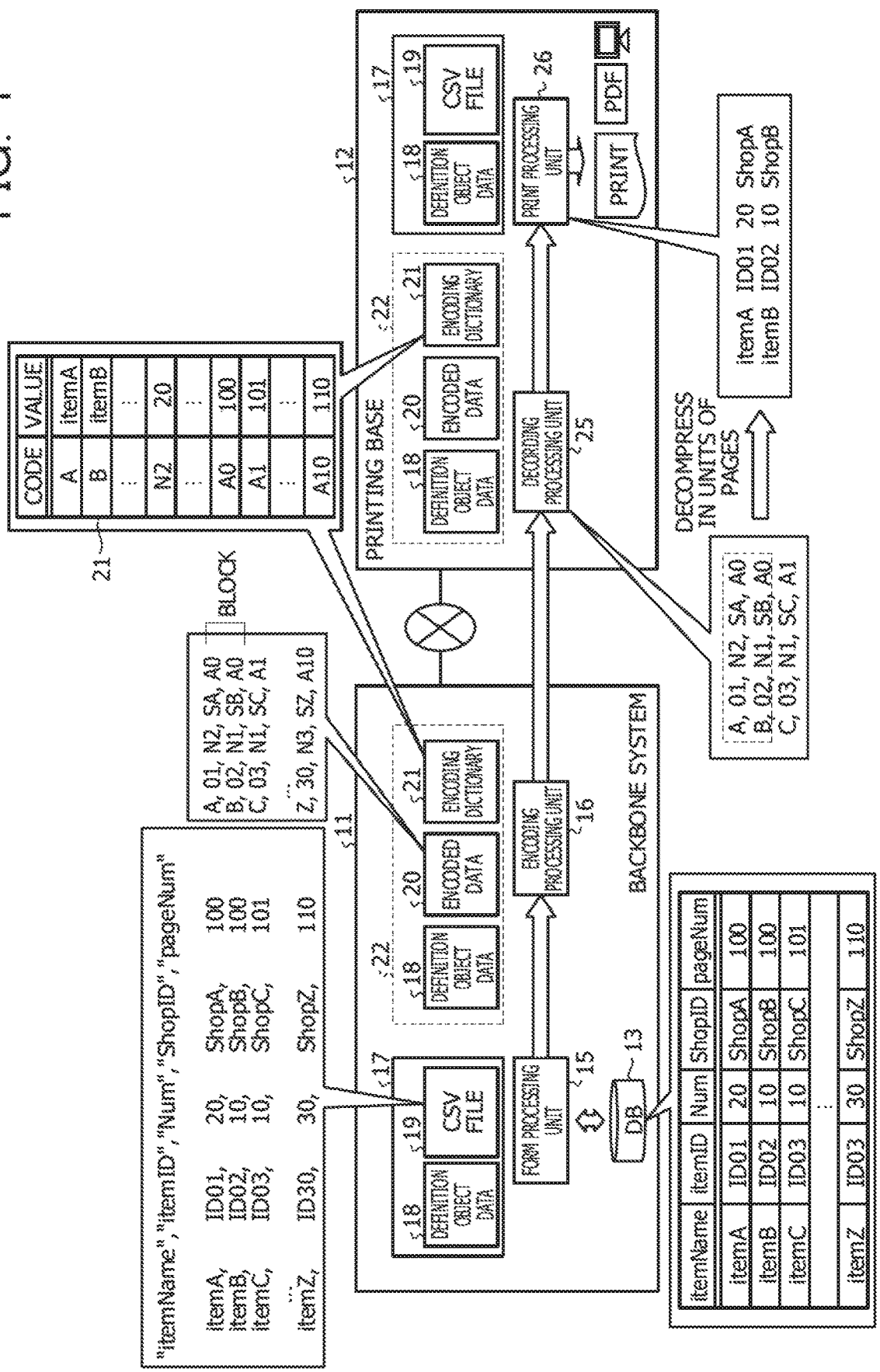
FIG. 1 is a diagram schematically illustrating a flow of printing of a form.

First, with reference to FIG. 1, an outline of encoding and decoding of a text file will be described. In the following, a case where it is applied to a system for printing a form will be described as an example. FIG. 1 is a diagram schematically illustrating a flow of printing the form. In FIG. 1, a backbone system 11 and a printing base 12 are illustrated. The backbone system 11 has a database (DB) 13. In the DB 13, information of the form is stored. The information of the form is, for example, "itemID", "Num", "ShopID" and "pageNum" associated with "itemName", but is not limited thereto.

The "itemName" is an item indicating a name of a commodity. The "itemID" is given for each commodity, and is an item indicating a number or the like for identifying the commodity. The "Num" is an item indicating a quantity of commodities. The "ShopID" is an item indicating a number or the like for identifying a shop where the commodity was ordered. The "pageNum" is an item indicating a page of the form, and is delimitation information indicating a page break.

The backbone system 11 includes a form processing unit 15 and an encoding processing unit 16. The form processing unit 15 generates data 17 for the form which is print data according to a form to be printed. For example, the form processing unit 15 creates data 17 for the form including definition object data 18 that defines form of the form, an arrangement position of each item, and the like, the comma-separated values (CSV) file 19 storing data of each item, and the like. In the CSV file 19, a plurality of records composed of data of a plurality of items delimited by commas are stored.

Here, in a case where the form is printed for a large number of items, the CSV file 19 may have a data amount of several hundred megabytes to several gigabytes. In a case of storing and transferring a large capacity CSV file 19, encoding such as compression is performed to improve efficiency of resources and transfer time.

Accordingly, the encoding processing unit 16 performs encoding of the CSV file 19 included in data 17 for the form. For the encoding processing unit 16, data 17 for the form to be encoded is input. The encoding processing unit 16 encodes the input data 17 for the form to generate an encoded file 22. The encoding processing unit 16 generates encoded data 20 and an encoding dictionary 21 that are obtained by independently encoding each piece of data of each item, which is included in the plurality of records of the CSV file 19 included in data 17 for the form, in units of words or numerical values. For example, the encoding processing unit 16 encodes each piece of data of the item "itemName" with a word and creates the encoded data 20. For example, the encoding processing unit 16 creates the encoding dictionary 21 in which each piece of data of the item "itemName" is associated with a code obtained by encoding each piece of data. In the following description, encoding data of the CSV file 19 included in data 17 for the form is also simply referred to as encoding data 17 for the form. In this manner, the created encoded data 20 is compressed data encoded in a state in which the page break can be identified.

The encoded file 22 is transferred to the printing base 12. In a case where the printing base 12 stores the encoding dictionary 21 or a case where the encoding dictionary 21 is separately obtainable, the encoding dictionary 21 may not be transferred to the printing base 12. The encoded data 20 is divided into blocks and transferred sequentially for each block. The block is, for example, data including a code obtained by encoding each piece of data of each item included in two records of the CSV file 19, but is not limited thereto. For example, the encoding dictionary 21 is transferred to the printing base 12 before the first block of the encoded data 20 is transferred. The encoding dictionary 21 may be transferred to the printing base 12 at the same time that the first block of the encoded data 20 is transferred.

The printing base 12 includes a decoding processing unit 25 and a print processing unit 26. The decoding processing unit 25 sequentially receives the encoded data 20 transferred for each block. When the page break is identified from the received encoded data 20, the decoding processing unit 25 partially decodes each code of the encoded data 20 into the data of the CSV file 19 using the encoding dictionary 21. For example, when encoded data 20 in units of pages is received, the decoding processing unit 25 decodes each code of the encoded data 20 into data of the CSV file 19 in units of pages before the reception of all encoded data 20 is completed. The unit of pages is, for example, one page, but is not limited thereto. The decoding processing unit 25 creates data 17 for the form by using the definition object data 18 and data of the partially decoded CSV file 19. Hereinafter, decoding each code of the encoded data 20 into data of the CSV file 19 is also simply referred to as decompressing the encoded data 20 onto data 17 for the form.

The print processing unit 26 prints data 17 for the form in the order of decompression. The print processing unit 26 may generate and output data of a print image such as portable document format (PDF) or the like using the decompressed data 17 for the form. As such, at the printing base 12, the page break of the encoded data 20 is identified, the encoded data 20 is partially decompressed onto data 17 for the form in units of pages, and printing of data 17 for the form starts in order of decompression.

Device Configuration

Figure 2:
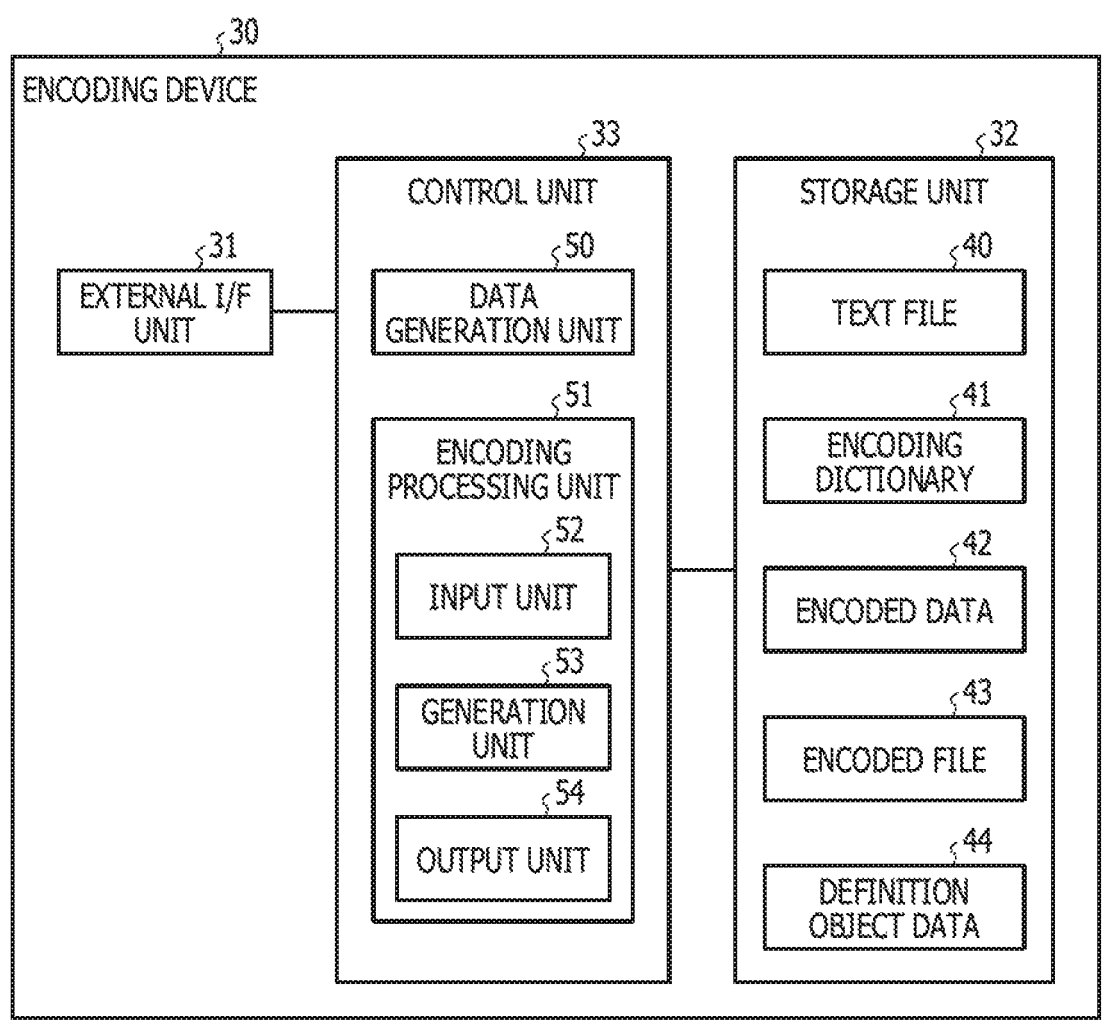
FIG. 2 is a diagram illustrating an example of a configuration of an encoding device.

Next, a configuration of each device will be described. First, a configuration of the encoding device 30 will be described. FIG. 2 is a diagram illustrating an example of the configuration of the encoding device 30. The encoding device 30 is a device that performs encoding such as compression on data for the form. The encoding device 30 is, for example, a computer such as a personal computer or a server computer, or an information processing device such as a tablet terminal or a smartphone. For example, in the example of FIG. 1, the encoding device 30 is a computer operating as the backbone system 11. The encoding device 30 may be implemented as a single computer or implemented as a cloud by a plurality of computers. In this example, a case where the encoding device 30 is a single computer will be described as an example. As illustrated in FIG. 2, the encoding device 30 includes an external interface (I/F) unit 31, a storage unit 32, and a control unit 33. The encoding device 30 may include other devices than the devices described above included in the computer and the information processing device.

The external I/F unit 31 is, for example, an interface for transmitting and receiving various information to and from other devices. The external I/F unit 31 is a port for inputting and outputting data to and from a storage medium such as a flash memory, a communication port for performing wired communication with a cable or the like, or a communication interface for performing wireless communication.

The storage unit 32 is a storage device such as a hard disk, a solid state drive (SSD), an optical disk. The storage unit 32 may be a semiconductor memory capable of rewriting data such as a random access memory (RAM), a flash memory, a non-volatile static random access memory (NVSRAM), or the like.

The storage unit 32 stores an operating system (OS) and various programs executed by the control unit 33. For example, the storage unit 32 stores a program for performing encoding processing to be described later. The storage unit 32 stores various data used by the programs to be executed by the control unit 33. For example, the storage unit 32 stores a text file 40, an encoding dictionary 41, an encoded data 42, an encoded file 43, and definition object data 44.

The text file 40 is data in which information of data for the form to be encoded is stored. For example, the text file 40 has a plurality of records composed of a plurality of items delimited by a delimiter, such as the CSV file 19 in the example of FIG. 1.

The encoding dictionary 41 is data of a dictionary used for encoding and decoding data for the form. For example, the encoding dictionary 41 corresponds to the encoding dictionary 21 in the example of FIG. 1. In the encoding dictionary 41, for each item of data for the form to be encoded, a different code corresponding to each piece of data of the item is stored. For example, the encoding dictionary 41 stores, for each item to be encoded, a code dynamically allocated corresponding to characteristics in units of words or numerical values appearing in each piece of data of item. For example, a short code is allocated to a word or numerical value with high appearance frequency, and dynamically allocated codes are stored in the encoding dictionary 41. For each item to be encoded, in a case where a pattern such as a character string or a number appearing in each piece of data of the item is determined as a specific pattern, the specific pattern and the code may be stored in advance in association with each other in the encoding dictionary 41. The encoding dictionary 41 may include item information indicating an encoded item.

The encoded data 42 is data obtained by encoding each piece of data of each item of the text file 40 by the encoding dictionary 41 and compressing the encoded data. For example, the encoded data 42 corresponds to the encoded data 20 of the example of FIG. 1.

The encoded file 43 is data obtained by combining the encoded data 42, the encoding dictionary 41 of each encoded item of the encoded data 42, and the definition object data 44 into one file. The definition object data 44 corresponds to the definition object data 18 of the example of FIG. 1.

The control unit 33 is a device that controls the encoding device 30. As the control unit 33, an electronic circuit such as a central processing unit (CPU), a micro processing unit (MPU) and the like, an integrated circuit such as an application specific integrated circuit (ASIC), a field programmable gate array (FPGA), and the like can be adopted. The control unit 33 includes internal memories for storing programs defining various processing procedures and control data, and executes various processing by the programs and control data. The control unit 33 functions as various processing units by operating various programs. For example, the control unit 33 includes a data generation unit 50 and an encoding processing unit 51.

The data generation unit 50 generates the text file 40 having a plurality of records obtained by delimiting data of a plurality of items by delimiters. The data generation unit 50 corresponds to the form processing unit 15 of the example of FIG. 1. The text file 40 may be generated by another device.

The encoding processing unit 51 encodes each piece of data of each item of the text file 40 by an encoding scheme corresponding to the item. The encoding processing unit 51 corresponds to the encoding processing unit 16 of the example of FIG. 1. The encoding processing unit 51 includes an input unit 52, a generation unit (compression unit) 53, and an output unit (transfer unit) 54.

The input unit 52 receives input of text data to be encoded. For example, the text file 40 is input to the input unit 52.

A generation unit 53 generates the encoded data 42 and the encoding dictionary 41 which encode each piece of data of each item of the text file 40. For example, the generation unit 53 allocates a code to each piece of data of each item of the text file 40 and registers the code and the data to which the code is allocated in association with the encoding dictionary 41 corresponding to the item. For the code, appearance frequency is obtained for words or numerical values included in data of each item and a short code is allocated to the word or numerical value with high appearance frequency. In a case where a pattern such as an appearing character string or number is determined as a specific pattern, the specific pattern and the code may be stored in advance in association with each other in the encoding dictionary 41. The generation unit 53 may allocate the code in order from a short code each time different data appears.

For example, for each item of the text file 40, the generation unit 53 converts the data into a code by using the encoding dictionary 41 corresponding to the item, and generates the encoded data 42 obtained by converting the data into the code. For example, in a case where a word or a numerical value is included in data of the item of the text file 40, the generation unit 53 converts the data of the text file 40 into a code which is corresponding to the word or the numerical value stored in the encoding dictionary 41 and the generation unit 53 generates the encoded file 43 including the generated encoded data 42 and the encoding dictionary 41 used for encoding the encoded data 42.

The generation unit 53 may generate the encoded file 43 including item information indicating the encoded item in the encoding dictionary 41. The generation unit 53 may allocate a code so as to be unique for each item to be encoded and register the code in the encoding dictionary 41 corresponding to the item. For example, codes may be duplicated for each item to be encoded. For example, for each item of the text file 40, the generation unit 53 allocates a code so as to be unique to data of the item and registers the code in the encoding dictionary 41 corresponding to the item. For the code, appearance frequency is obtained for the words or numerical values contained in the data and a short code is allocated to the word or numerical value with high appearance frequency, for each item. As such, since it is possible to allocate the short code in duplicate for each item to be encoded by allocating the code so that the code is unique for each item to be encoded, data can be encoded at a high compression ratio for each item to be encoded. For each item to be encoded, in a case where a pattern of an appearing character string, number or the like is determined as a specific pattern, the specific pattern and the code may be stored in advance in association with each other in the encoding dictionary 41 corresponding to the item to be encoded. The generation unit 53 may allocate the code in order from a short code each time different data appears, for each item to be encoded.

The output unit 54 transfers the encoded file 43 to a decoding device 60, which will be described later, via the external I/F unit 31. The output unit 54 divides the encoded data 42 and sequentially transfers the divided encoded data 42 to the decoding device 60 for each block. For example, the output unit 54 transfers the encoding dictionary 41 to the decoding device 60 before the transfer of the first block. The output unit 54 may transfer the encoding dictionary 41 to the decoding device 60 at the same time as the transfer of the first block.

FIG. 3 is a diagram illustrating an example of a text file 40 before encoding. In FIG. 3, a plurality of records having the "itemName", "itemID", "Num", "ShopID", and "pageNum" as items of data for the form are illustrated. In the text file 40 before encoding illustrated in FIG. 3, matters that information on the "itemA" and "itemB" is described in the page 100 of data for the form, and information on the "itemC" is described in the page 101 of data for the form are illustrated. In the text file 40 before encoding illustrated in FIG. 3, matters that information on the "itemD" is described in the page 102 of data for the form are illustrated. In FIG. 3, the items of data for the form and records in one page in FIG. 3 are examples, and for example, in one page, more records are included than in the example illustrated in FIG. 3.

FIG. 4 is a diagram illustrating an example of the encoded data 42. In the encoded data 42 illustrated in FIG. 4, each piece of data of each item surrounded by a broken line in FIG. 3 is encoded. For example, the "itemA" of the item "itemName" is encoded into "A", the "itemB" is encoded into "B", and the "itemC" is encoded into "C". Also, the "ID01" in the item "itemID" is encoded into "01" and the "ID02" is encoded into "02". The "20" in the item "Num" is encoded into "N2" and the "10" is encoded into "N1". The "ShopA" in the item "ShopID" is encoded into "SA" and the "ShopB" is encoded into "SB". The "100" in the item "pageNum" is encoded into "A0", the "101" is encoded into "A1", and the "110" is encoded into "A10". In the encoded data 42, a code obtained by encoding data of two records is divided into one block. For example, one block includes a code obtained by encoding each piece of data of a record to which the "itemA" belongs and a code obtained by encoding each piece of data of a record to which the "itemB" belongs. The divided encoded data 42 is sequentially transferred to the decoding device 60 for each block.

FIG. 5 is a diagram illustrating an example of the encoding dictionary 41. In the encoding dictionary 41 illustrated in FIG. 5, each piece of data of each item of the text file 40 before encoding illustrated in FIG. 3 and each code of each item of the encoded data 42 illustrated in FIG. 4 are stored in association with each other. For example, the "A" of "CODE" is stored in association with the "itemA" of "VALUE" and the "B" of "CODE" is stored in association with the "itemB" of "VALUE".

Figure 6:
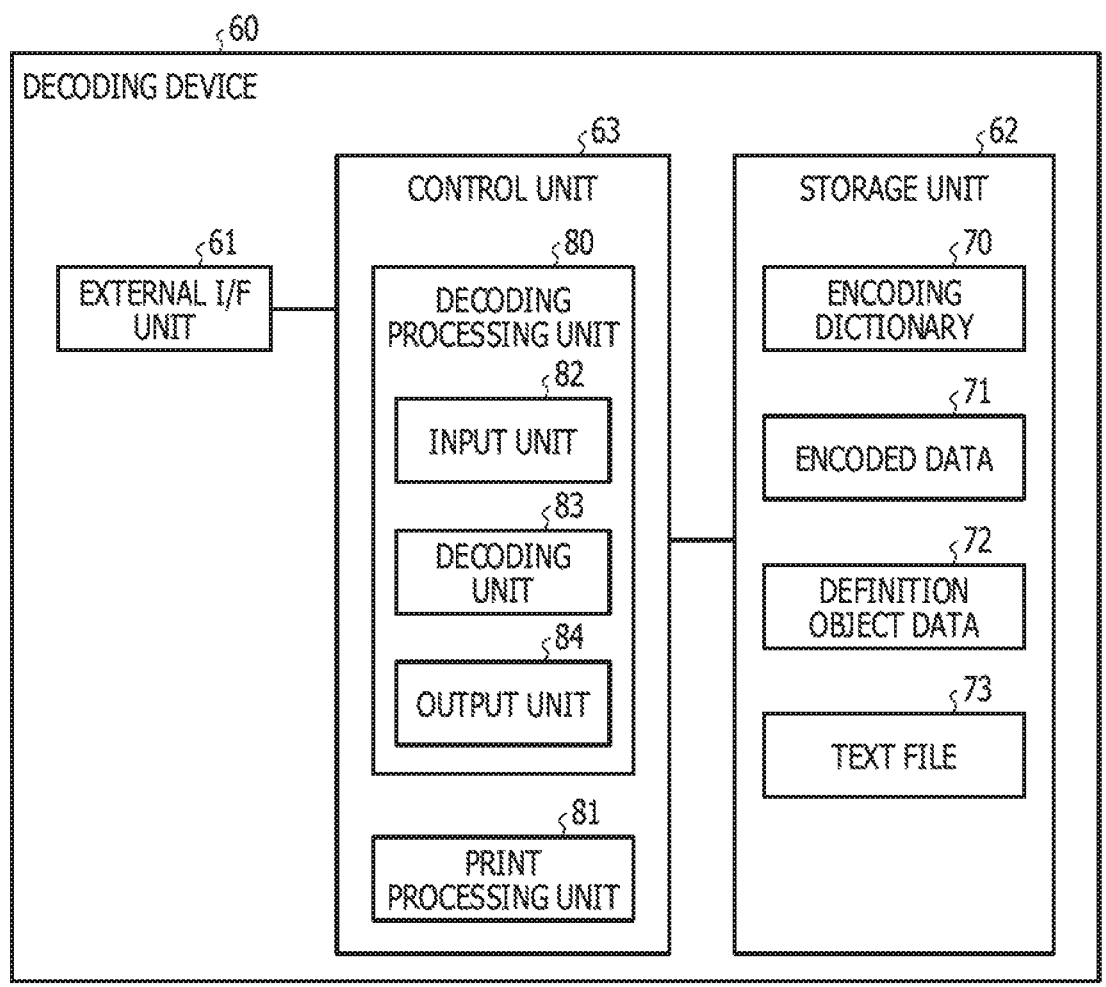
FIG. 6 is a diagram illustrating an example of a configuration of a decoding device.

Next, a configuration of the decoding device 60 will be described. FIG. 6 is a diagram illustrating an example of the configuration of the decoding device 60. The decoding device 60 is a device that decodes the encoded data 42 into data for the form and prints the form. The decoding device 60 is, for example, a computer such as a personal computer, a server computer, and the like or an information processing device such as a tablet terminal, a smartphone, or the like. For example, in the example of FIG. 1, the decoding device 60 is a computer that operates as the printing base 12. The decoding device 60 may be implemented as a single computer or as a cloud by a plurality of computers. In this embodiment, a case where the decoding device 60 is a single computer will be described as an example. As illustrated in FIG. 6, the decoding device 60 includes an external I/F unit (reception unit) 61, a storage unit 62, and a control unit 63. The decoding device 60 may include other devices than the devices described above included in the computer and the information processing device.

The external I/F unit 61 is, for example, an interface for transmitting and receiving various information to and from other devices. The external I/F unit 61 is a port for inputting and outputting data to and from a storage medium such as a flash memory, a communication port for performing wired communication with a cable or the like, or a communication interface for performing wireless communication.

The storage unit 62 is a storage device such as a hard disk, an SSD, an optical disk, or the like. The storage unit 62 may be a semiconductor memory capable of rewriting data, such as the RAM, the flash memory, the NVSRAM, or the like.

The storage unit 62 stores the OS and various programs executed by the control unit 63. For example, the storage unit 62 stores a program for performing print processing to be described later. The storage unit 62 stores various data used in the program executed by the control unit 63. For example, the storage unit 62 stores the encoding dictionary 41, the encoded data 42, the definition object data 44, and the text file 40 included in the encoded file 43 transferred through the external I/F unit 61. The storage unit 62 stores the encoded data 42 in order of blocks transferred from the encoding device 30.

The control unit 63 is a device that controls the decoding device 60. As the control unit 63, an electronic circuit such as the CPU, the MPU and the like, an integrated circuit such as the ASIC, the FPGA, and the like can be adopted. The control unit 63 includes internal memories for storing programs defining various processing procedures and control data, and executes various processing by the programs and control data. The control unit 63 functions as various processing units by operating various programs. For example, the control unit 63 includes a decoding processing unit 80 and a print processing unit 81.

The decoding processing unit 80 decodes the encoded data 42. The decoding processing unit 80 corresponds to the decoding processing unit 25 in the example of FIG. 1. The decoding processing unit 80 includes an input unit 82, a decoding unit (decompression unit) 83, and an output unit 84.

The input unit 82 receives an input of the encoding dictionary 41 and an input of the encoded data 42 to be decoded. The encoded data 42 is input to the input unit 82 in order of blocks transferred from the encoding device 30. The encoding dictionary 41 stored in the storage unit 62 is input to the input unit 82.

The decoding unit 83 decodes the encoded data 42 using the encoding dictionary 41. The decoding unit 83 identifies the page break of the encoded data 42 and decodes the encoded data 42 in units of pages, using the encoding dictionary 41. For example, when the decoding unit 83 identifies the page break of the encoded data 42 and the encoded data 42 corresponding to the text file 40 for one page is input, the decoding unit 83 partially decodes the encoded data 42 into the text file 40. For example, the decoding unit 83 partially decompresses the encoded data 42 for one page onto data for the form by using the encoding dictionary 41.

FIG. 7 is a diagram illustrating an example of the encoded data 42 received by the decoding device 60. In FIG. 7, the encoded data 42 in which the encoded data 42 illustrated in FIG. 4 is received is illustrated. When the encoded data 42 is divided and transferred to the decoding device 60 for each block, the decoding device 60 receives the encoded data 42 in order of transfer. When two blocks are received, the code of the "pageNum" which is information indicating the page break is changed from the "A0" to the "A1". For that reason, it is understood that the reception of the encoded data 42 for one page is completed. The decoding unit 83 partially decompresses the encoded data 42 for one page onto data for the form by using the encoding dictionary 41. In the example illustrated in FIG. 7, by receiving the second block, the code of "pageNum" which is information indicating the page break is changed from the "A1" to the "A2". For that reason, it is understood that that the reception of the encoded data 42 for one page is completed. The decoding unit 83 may partially decompress the encoded data 42 for two pages onto data for the form using the encoding dictionary 41.

The output unit 84 outputs the text file 40 partially decoded by the decoding unit 83 to the print processing unit 81 in order of encoding.

The print processing unit 81 prints the text file 40 output by the output unit 84 in order of output using the definition object data 44. The print processing unit 81 starts printing the decoded text file 40 in units of pages without waiting for reception and decoding of all the encoded data 42.

Figure 8:
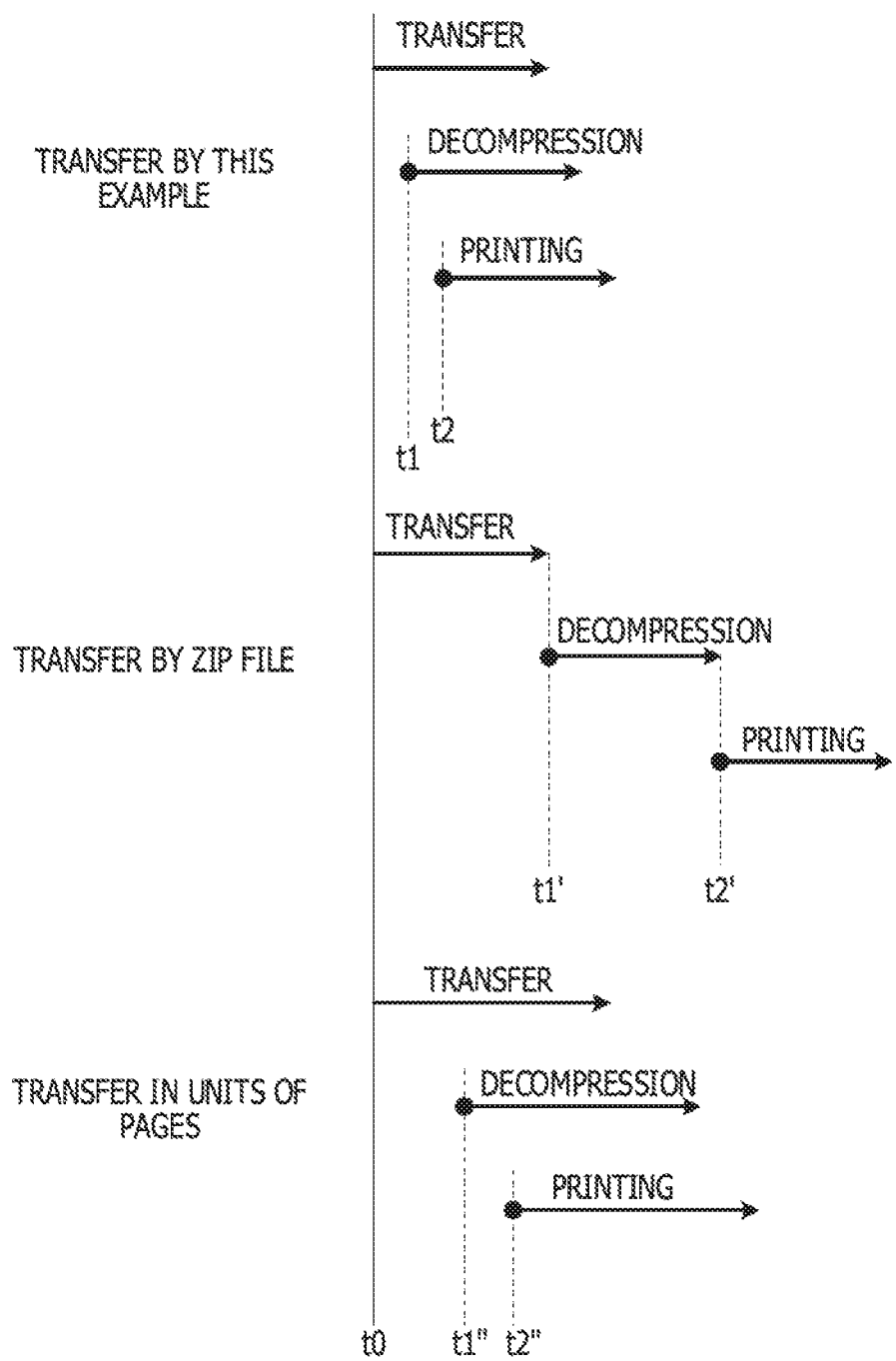
FIG. 8 is a diagram illustrating an example of a processing time until the form is printed.

Here, an example of the processing time until the form is printed will be described. FIG. 8 is a diagram illustrating an example of the processing time until the form is printed.

In this example, the encoding device 30 encodes each piece of data of each item of the text file 40 for each item, and creates the encoded data 42. The encoding device 30 can increase the compression ratio of the encoded data 42. With this configuration, the transfer time (reception time of the encoded data 42) of the encoded data 42 becomes shorter.

At time t0, when reception of the encoded data 42 is started, the decoding device 60 identifies the page break from among the encoded data 42 transferred for each block. At time t1, when a page break of the first page is identified, the decoding device 60 starts partial decompression of the encoded data 42 of the first page. For example, at time t2, when partial decompression of the encoded data 42 of the first page is completed, the decoding device 60 starts printing of the form of the first page. With this configuration, the time until the first print is started becomes shorter.

In contrast, for example, in a case where a text file that is data for the form is encoded, it is conceivable to compress the text file into a ZIP file or the like using a compression format such as ZIP format and transfer the text file to a decoding device. Also, with this configuration, the transfer time of ZIP file becomes shorter.

However, due to the nature of the ZIP file, the ZIP file is not partially decompressed. In this comparative example, when the transfer of the ZIP file is started at time t0, decompression of the ZIP file is started at time t1' at which the transfer of the ZIP file is completed. For example, at time t2' at which decompression of the ZIP file is completed, printing of the form is started. For that reason, the time until the first print is started becomes longer.

For example, it is conceivable to encode a text file in units of pages and transfer the encoded data to the decoding device.

However, as in this comparative example, when the text file is encoded in units of pages, as illustrated in FIG. 9, data included in each item is reduced. FIG. 9 is a diagram illustrating an example of encoding in units of pages. In FIG. 9, each record included in units of pages is surrounded by a broken line. When data included in each item is reduced, it is not possible to distinguish words or numerical values with high appearance frequency for the words or numerical values included in data for each item, and the compression ratio is lowered. For that reason, the transfer capacity increased and the transfer time becomes longer. As illustrated in FIG. 8, for example, when the transfer of compressed data is started at time t0, since the transfer time is long, the time until the time t1" at which the decompression of the compressed data is started becomes longer. The time t2" until printing of the form is started becomes longer, and the time until the first print is started becomes longer. The time until the printing of the form is completed becomes longer.

In this example, when the decoding device 60 has the encoding dictionary 41, it is possible to further shorten the time until the first print is started as compared with the comparative example.

Flow of Processing

Figure 10:
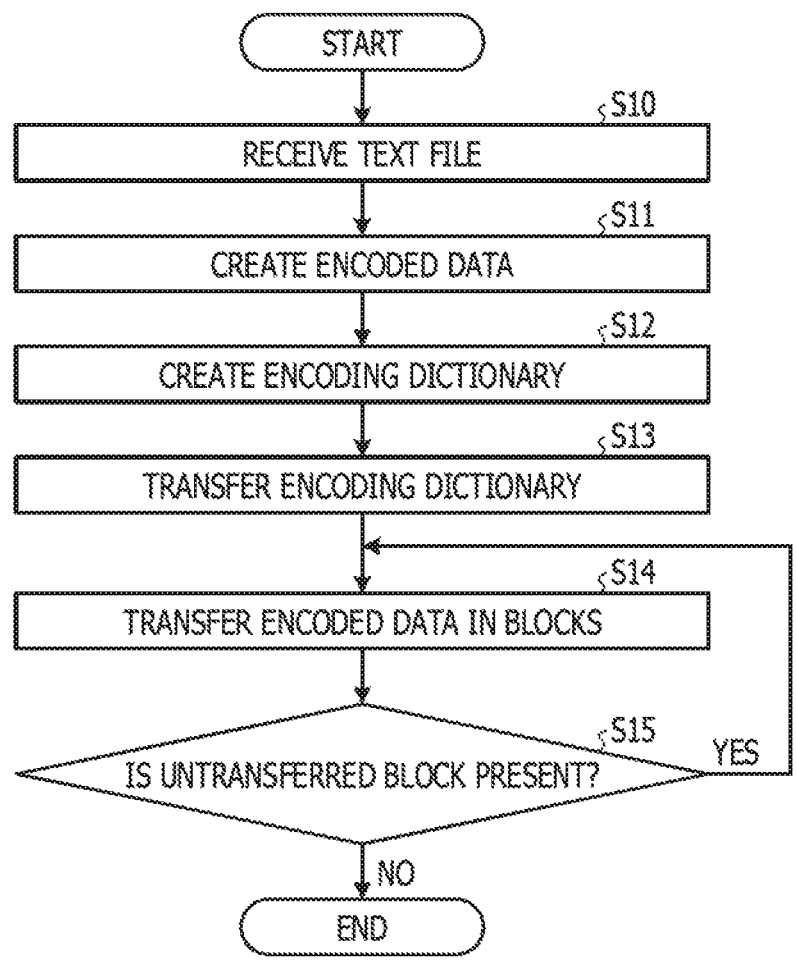
FIG. 10 is a flowchart illustrating an example of a procedure of encoding processing.

Next, the flow of various processing executed by the encoding device 30 and the decoding device 60 according to this example will be described. First, the flow of encoding processing in which the encoding device 30 encodes the text file 40 will be described. FIG. 10 is a flowchart illustrating an example of a procedure of the encoding processing. This encoding processing is executed at a predetermined timing, for example, at a timing when processing of the data generation unit 50 is executed.

As illustrated in FIG. 10, the input unit 52 receives input of the text file 40 to be encoded (S10).

The generation unit 53 allocates codes to each piece of data of each item of the text file 40 to create the encoded data 42 (S11). The generation unit 53 generates the encoding dictionary 41 by associating each piece of data of each item of the text file 40 with the code allocated to each piece of data (S12).

The output unit 54 transfers the encoding dictionary 41 to the decoding device 60 (S13). The output unit 54 divides the encoded data 42 and transfers the divided encoded data 42 for each block (S14). The output unit 54 determines whether or not an untransferred block of the encoded data 42 is present (S15). When it is determined that the untransferred block is present (Yes in S15), process proceeds to S14. On the other hand, when it is determined that the untransferred block is not present (No at S15), the encoding processing is ended.

Figure 11:
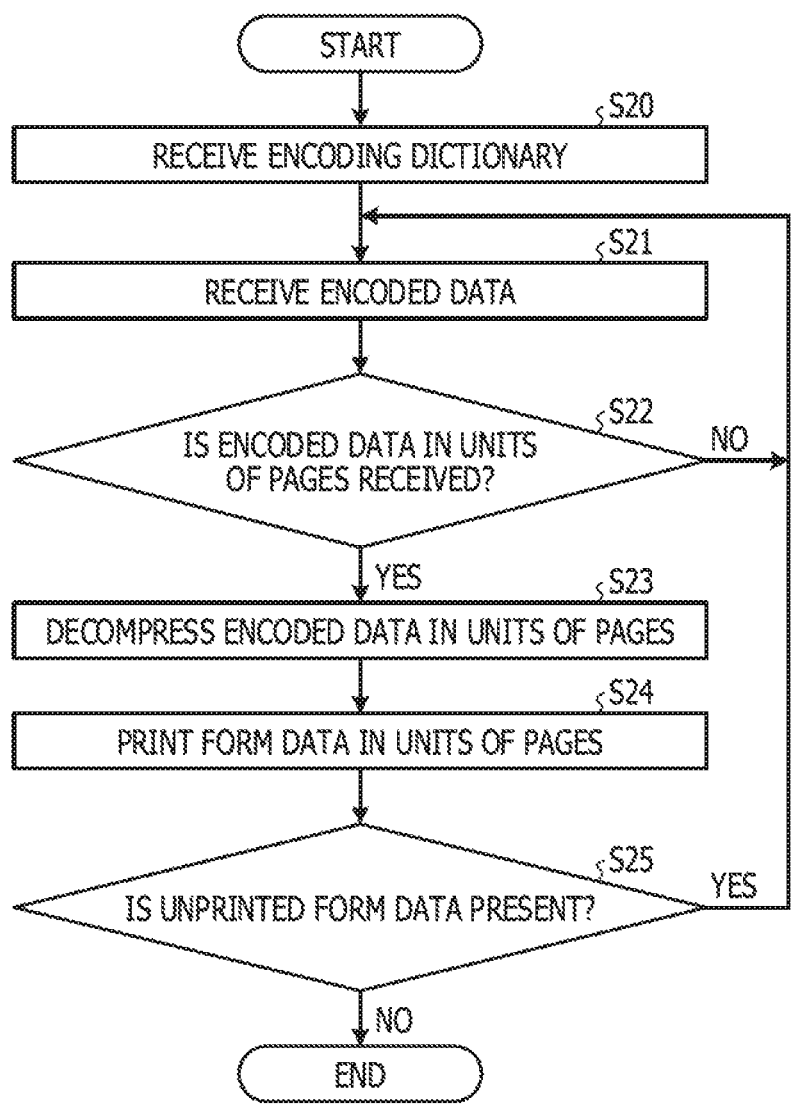
FIG. 11 is a flowchart illustrating an example of a procedure of print processing.

Next, the flow of the print processing in which the decoding device 60 decodes the encoded data 42 and prints the encoded data 42 will be described. FIG. 11 is a flowchart illustrating an example of a procedure of the print processing. This print processing is executed at a predetermined timing, for example, at a timing at which a print instruction is given from the encoding device 30.

As illustrated in FIG. 11, the input unit 82 receives input of the encoding dictionary 41 (S20). The input unit 82 receives the divided encoded data 42 for each block (S21).

The decoding unit 83 identifies the page break of the encoded data 42 and determines whether or not the encoded data 42 in units of pages is received (S22). When it is determined that the encoded data 42 in units of pages is received (Yes in S22), the decoding unit 83 partially decompresses the encoded data 42 in units of pages onto data for the form using the encoding dictionary 41 (S23). On the other hand, when it is determined that the encoded data 42 in units of pages is not received (No in S22), the processing proceeds to S21.

The print processing unit 81 prints the decompressed form in units of pages (S24).

The decoding unit 83 determines whether or not an unprinted form is present (S25). When it is determined that the unprinted form is present (Yes in S25), the processing proceeds to S21.

When it is determined that the unprinted form is not present (No in S25), the decoding unit 83 ends the print processing.

Effect

The decoding device 60 according to this example receives the encoded data 42 (compressed data) in which data for the form (print data) having a plurality of pages is encoded in a state where a page break can be identified and the encoding dictionary 41 used for encoding. Using the encoding dictionary 41, the decoding device 60 identifies the page breaks of the pages of the received encoded data 42, and partially decompresses the data onto data for the form in units of pages. The decoding device 60 outputs data for the form in the order of decompression. With this configuration, the decoding device 60 can shorten the time until the first print is started.

The decoding device 60 according to this example receives the encoding dictionary 41 before the encoded data 42. With this configuration, the decoding device 60 can partly decompress the encoded data 42 onto data for the form based on the page break of the pages included in the encoded data 42 by using the encoding dictionary 41. For that reason, the decoding device 60 can print partially decompressed data for the form and shorten the time until the first print starts.

The encoded data 42 according to this example is encoded in a state where the page break can be identified by encoding items related to page information included in data for the form independently of other items. With this configuration, the decoding device 60 can partly decompress the encoded data 42 onto data for the form based on the page break included in the encoded data 42. For that reason, the decoding device 60 can print the partially decompressed data for the form and shorten the time until first print starts.

The data for the form according to this example has a plurality of items, and a plurality of items of the encoded data 42 are encoded with different codes. With this configuration, even in a case where data for the form includes a plurality of items, encoding can be performed with a high compression ratio for each item, the transfer time of the encoded data 42 can be shortened, and the time until the output of data for the form is completed can be shortened.

EXAMPLE 2

Although the example relating to the devices disclosed so far is described, the disclosed technology may be implemented in various different forms in addition to the example described above. Therefore, another example included in the present disclosure will be described below.

In the example described above, the case where the page break is determined based on the code of the item indicating the page of the form in the text file 40 is described as an example, but the disclosed device is not limited thereto. For example, the encoded data 42 may have information of page change as a code at the end of the page. The decoding unit 83 may determine the page break based on the code of the page change information.

In the example described above, the case where a page unit is, for example, one page is described as an example, but the disclosed device is not limited thereto. For example, at least one of the encoding device 30 and the decoding device 60 may be capable of setting the page unit.

In the example described above, the example in which the encoded data 42 is transferred in the order of the divided blocks is described, but the disclosed device is not limited thereto. For example, the information of "pageNum" may be referred to for each block, and the printing may be started by partial decompression. Also, with this configuration, the decoding device 60 can shorten the time until the first print is started.

For example, the constituent elements of each device illustrated in the drawings are functionally conceptual and may not be physically configured as illustrated. For example, the concrete state of distribution and integration of each device is not limited to those illustrated in the drawings, and all or a part thereof can be configured by being functionally or physically distributed and integrated in certain units according to various loads and usage situations. For example, the respective processing units of the input unit 52, the generation unit 53, the output unit 54, the input unit 82 of the decoding processing unit 80, the decoding unit 83, the output unit 84 of the encoding processing unit 51, and the print processing unit 81 may be appropriately integrated. Processing of each of the processing units described above may be separated into processing of a plurality of processing units as appropriate. Each of the processing units described above may be provided in one device. For example, the encoding device 30 may further include the print processing unit 81, the input unit 82, the decoding unit 83, and the output unit 84 of the decoding processing unit 80. All or any part of each processing function performed in each processing unit is realized by the CPU and a program analyzed and executed by the CPU, or all or any part of each processing function can be realized as hardware by wired logic.

Encoding Program

Figure 12:
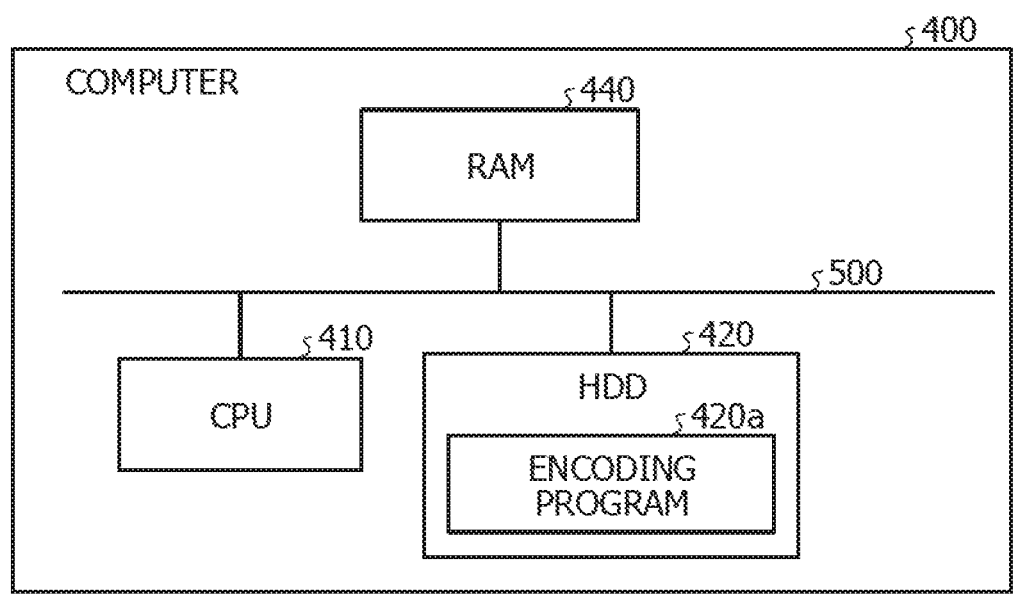
FIG. 12 is a diagram illustrating an example of a computer that executes an encoding program.

Various processing described in the examples described above can also be realized by executing a prepared program on a computer system such as a personal computer or a workstation. Therefore, in the following, an example of a computer system that executes a program having the same function as the examples described above will be described. First, an encoding program for performing the encoding processing will be described. FIG. 12 is a diagram illustrating an example of a computer that executes the encoding program.

As illustrated in FIG. 12, a computer 400 includes a central processing unit (CPU) 410, a hard disk drive (HDD) 420, and a random access memory (RAM) 440. Each of these units 400 to 440 is connected via a bus 500.

In the HDD 420, an encoding program 420a exhibiting the same function as the encoding processing unit 51 (input unit 52, generation unit 53, and output unit 54) of the encoding device 30 is stored in advance. The encoding program 420a may be appropriately separated.

The HDD 420 stores various information. For example, the HDD 420 stores OS and various data used for encoding.

The CPU 410 reads the encoding program 420a from the HDD 420 and executes the encoding program 420a so as to execute the same operation as each processing unit of the example. For example, the encoding program 420a performs the same operation as the encoding processing unit 51.

The encoding program 420a may not be stored in the HDD 420 from the beginning.

Printing Program

Figure 13:
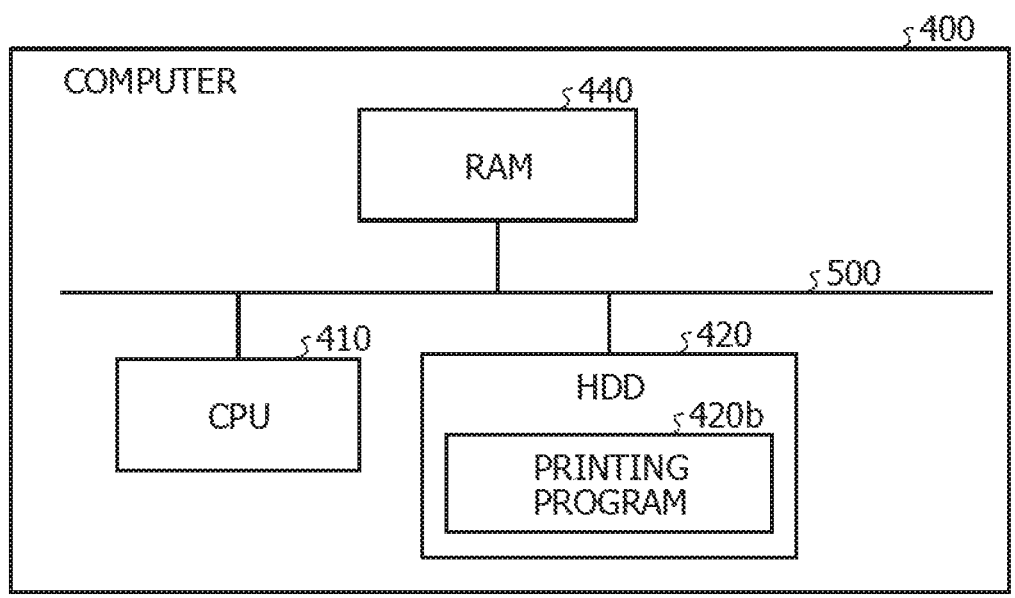
FIG. 13 is a diagram illustrating an example of a computer that executes a printing program.

Next, a printing program for performing print processing will be described. FIG. 13 is a diagram illustrating an example of a computer that executes the printing program. The same parts as those in FIG. 12 are denoted by the same reference numerals, and a description thereof will be omitted.

As illustrated in FIG. 13, in the HDD 420, the decoding processing unit 80 (input unit 82, decoding unit 83, output unit 84) of the decoding device 60 and a printing program 420b exhibiting the same function as the print processing unit 81 are stored in advance. The printing program 420b may be appropriately separated.

The HDD 420 stores various information. For example, the HDD 420 stores the OS and various data used for retrieval.

The CPU 410 reads the printing program 420b from the HDD 420 and executes the printing program 420b so as to execute operations similar to those of respective processing units of the examples. For example, the printing program 420b executes the same operations as the decoding processing unit 80 and the print processing unit 81.

The printing program 420b described above may not be stored in the HDD 420 from the beginning.

For example, the encoding program 420a and the printing program 420b may be stored in a "portable physical medium" such as a flexible disk (FD), a CD-ROM, a DVD disk, a magneto optical disk, and an IC card inserted into the computer 400. For example, the computer 400 may read and execute the program from the disks and the IC card.

The program may be stored in "another computer (or server)" or the like connected to the computer 400 via a public line, the Internet, a LAN, a WAN, or the like. For example, the computer 400 may read and execute the program from the other computer or the like.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A non-transitory computer-readable storage medium for storing a program which causes a processor to perform processing for output, the processing comprising:
   receiving compressed data and an encoding dictionary, the received compressed data including a plurality of data sets, each data set including first encoded data and second encoded data, the first encoded data being obtained by encoding an item included in one of a plurality of pages of print data, the second encoded data being obtained by encoding page information corresponding to the item, the page information indicating the one of the plurality of pages, the encoding dictionary including data used for the encoding;
   identifying, for a respective data set included in the received compressed data, a page break of the received compressed data by comparing the second encoded data between the respective data set and a data set adjacent to the respective data set;
   in response to the identified page break, partially decompressing the received compressed data into the print data in units of pages, by using the encoding dictionary; and
   outputting the print data in order of the decompression.

2. The computer-readable recording medium according to claim 1,
   wherein the receiving is configured to receive the encoding dictionary before the compressed data.

3. The computer-readable recording medium according to claim 1, wherein
   the print data has a plurality of items, and
   in the compressed data, the plurality of items are encoded with codes different from each other.

4. An output method executed by a computer, the method comprising:
   receiving compressed data and an encoding dictionary, the received compressed data including a plurality of data sets, each data set including first encoded data and second encoded data, the first encoded data being obtained by encoding an item included in one of a plurality of pages of print data, the second encoded data being obtained by encoding page information corresponding to the item, the page information indicating the one of the plurality of pages, the encoding dictionary including data used for the encoding;
   identifying, for a respective data set included in the received compressed data, a page break of the received compressed data by comparing the second encoded data between the respective data set and a data set adjacent to the respective data set;
   in response to the identified page break, partially decompressing the received compressed data into the print data in units of pages, by using the encoding dictionary; and
   outputting the print data in order of the decompression.

5. The method according to claim 4,
   wherein the receiving is configured to receive the encoding dictionary before the compressed data.

6. The method according to claim 4, wherein
   the print data has a plurality of items, and
   in the compressed data, the plurality of items are encoded with codes different from each other.

7. An output system comprising:
   a memory; and
   a processor coupled to the memory, the processor being configured to:
   execute a compression process that includes creating compressed data encoded in a state in which a page break is identifiable in print data having a plurality of pages, the compressed data including a plurality of data sets, each data set including first encoded data and second encoded data, the first encoded data being obtained by encoding an item included in one of the plurality of pages of the print data, the second encoded data being obtained by encoding page information corresponding to the item, the page information indicating the one of the plurality of pages;
   execute a creation process that includes creating an encoding dictionary including data used for the encoding;
   execute a transfer process that includes
      transferring the encoding dictionary created by the creation process to another location,
      dividing the compressed data created by the compression process, and
      sequentially transferring the divided compressed data to the another location;
   execute a reception process that includes receiving the encoding dictionary transferred by the transfer process and the divided compressed data sequentially transferred by the transfer process at the another location;
   execute a decompression process that includes
      identifying, for a respective data set included in the received compressed data, a page break of the compressed data received by the reception process, the identifying of the page break being performed by comparing the second encoded data between the respective data set and a data set adjacent to the respective data set, and
      in response to the identified page break, partially decompressing the received compressed data into the print data in units of pages, by using the encoding dictionary received by the reception process; and
   execute an output process that includes outputting the print data in order of the decompression by the decompression process.

* * * * *